United States Patent [19]

Christensen et al.

[11] Patent Number: 4,526,859
[45] Date of Patent: Jul. 2, 1985

[54] METALLIZATION OF A CERAMIC SUBSTRATE

[75] Inventors: Richard G. Christensen, Wingdale; Robert L. Moore, Poughkeepsie, both of N.Y.

[73] Assignee: International Business Machines Corporation, Armonk, N.Y.

[21] Appl. No.: 560,661

[22] Filed: Dec. 12, 1983

[51] Int. Cl.³ .............................................. H05K 3/10
[52] U.S. Cl. ................. 430/314; 204/192 C; 204/192 N; 427/96; 427/259; 427/38; 430/318; 430/319
[58] Field of Search .................. 430/314, 318, 319; 427/96, 259, 38; 204/192 C, 192 N

[56] References Cited

U.S. PATENT DOCUMENTS

| | | | |
|---|---|---|---|
| 3,506,441 | 4/1970 | Gottfried | 96/36.2 |
| 3,518,756 | 7/1970 | Bennett et al. | 29/625 |
| 3,540,894 | 11/1970 | McIntosh | 106/39 |
| 3,634,159 | 1/1972 | Croskery | 156/3 |
| 3,700,443 | 10/1972 | Reimann | 430/314 |
| 3,726,002 | 4/1973 | Greenstein et al. | 29/577 |
| 3,767,398 | 10/1973 | Morgan | 96/36.2 |
| 3,957,552 | 5/1976 | Ahn et al. | 156/11 |
| 3,968,193 | 7/1976 | Langston, Jr. et al. | 264/61 |
| 3,991,231 | 11/1976 | Trausch | 427/96 |
| 4,221,047 | 9/1980 | Narken et al. | 29/840 |
| 4,293,637 | 10/1981 | Hatada | 430/314 |
| 4,430,365 | 2/1984 | Schaible | 427/96 |
| 4,442,137 | 4/1984 | Kumar | 427/96 |

OTHER PUBLICATIONS

IBM Technical Disclosure Bulletin, vol. 15, No. 8, Jan. 1973, "Replaceable Engineering Change Pad", by J. G. Simek, pp. 2575-2576.
IBM Technical Disclosure Bulletin, vol. 20, No. 5, Oct. 1977, "Electroplating Process for Forming Heavy Gold Plating on Multilayer Ceramic Substrates", by D. Loehndorf, p. 1740.

Primary Examiner—John D. Smith
Attorney, Agent, or Firm—Henry Powers

[57] ABSTRACT

There is disclosed a method of selectively metallizing a ceramic substrate provided with a metallization pattern according by photoresist processing. A first layer of photoresist is blanket deposited over the substrate exposed through a coarse block out mask, and developed in order to protect those areas of the metallization pattern not to be covered with metal. A blanket metal layer is then formed over the entire substrate surface. A second layer of photoresist is deposited, exposed through a customized mask of the metallization pattern, and developed. The exposed metal is etched and the remaining first and second photoresist layers are removed, leaving a coating of metal only at desired locations.

The method may be used for the heavy gold deposition over the Engineering change pads used as a standard in multilayer ceramic substrates.

17 Claims, 2 Drawing Figures

METALLIZATION OF A CERAMIC SUBSTRATE

BACKGROUND OF THE INVENTION

1. Field of Invention

The present invention relates to integrated circuit packaging and, more particularly, to a photoresist process for depositing metal at only selected portions of a metallization pattern pre-existing on ceramic substrate carriers, such as, for example, multilayer ceramic substrates employed as a support for mounting semiconductors devices thereon.

2. Description of the Prior Art

The multilayer ceramic (MLC) technology for fabricating dielectric substrate carriers for integrated circuit/semiconductor package assemblies is well known in the art.

In large scale integrated circuit packages, it is known to provide a ceramic substrate with engineering change (EC) pads in addition to the signal Input/Output (I/O) pads to be solder bonded to active devices, such as semiconductor chips. In actual practice, each of the I/O pads can be associated with and connected to an EC pad, so the EC pads can be used to test the circuitry of the module, the device connection as well as the device itself. In addition, these EC pads provide a means for altering the internal circuitry of the substrate. The concept is described in more detail in U.S. Pat. Nos. 3,726,002, 3,968,193 and 4,221,047 assigned to the assignee of this application, and in the IBM Technical Disclosure Bulletin, Vol, 15 No. 8 January 1973 P. 2575. In use, discrete wires are ultrasonically bonded to the EC pads which provide additional or alternate wiring capable of connecting the various I/O pads of the devices mounted on the substrate.

EC pads are metallurgical areas which individually or collectively require electroplating with a thick film of gold, so called heavy gold. The advantage of gold lies in its well-known ability to provide both low-ohmic contacts and good adhesion between the metallurgical area and the fine interconnecting wire. An electroplating method for forming heavy gold plating on MLC substrates is described in IBM Technical Disclosure Bulletin, Vol, 20 No. 5, October 1977, page 1740. Applying heavy gold on these pads by a plating process has an history of problems. At times, the heavy gold blisters, at others times, adhesion of gold is poor.

SUMMARY OF THE INVENTION

In its broadest context, this invention comprehends the covering one of two sets of pre-existing conductive pads (e.g. EC or I/O), at a surface of a substrate, with a removable protective coating followed by formation on the other unprotected set of conductive pads of a gold coating, subsequent to which the protective coating is removed.

More specifically, the above noted problems may be minimized or even avoided according to the process of the present invention as described herein. In a preferred form, the process includes the steps of:

1. providing a multilayer ceramic substrate having an existing metallization pattern over a major surface, as for example a plurality of I/O and EC conductive pads;
2. depositing a first layer of photoresist to blanket coat or cover the substrate major surface and metallization pattern;
3. selectively exposing though a first mask and developing the first photoresist layer according to a first desired pattern which fixes a photoresist mask or protective coating only over a desired region of the substrate, e.g. only over a substrate containing a subdivided portion of the particular portion of the metallization pattern, e.g., one of two sets of pre-existing conductive pads (EC or I/O);
4. depositing a blanket layer of metal, as for example gold, over the entire substrate major surface;
5. depositing a second layer of photoresist over the substrate major surface;
6. selectively exposing through a second mask and developing the second photoresist layer to define a second desired pattern retaining a resist coating superposed over the other portion of the metallization pattern (e.g. the other set of conductive pads) in conjunction with a disjointed but conforming resist mask over the previously formed protective first resist coating;
7. etching portions of the deposited metal layer which have been exposed by the second resist formed mask; and,
8. removing (e.g. solvating) the photoresist layers to float or lift off the overlying deposited metal and the second layer of photoresist at the region of the substrate covering said desired region of the first metallization pattern (e.g. first set of conductive pads) not to be covered with the metal layer.

A principal feature of the process is the depositing and patterning of the first sheath layer of photoresist to cover that region of the substrate, which includes the I/O pads, to be shielded from the deposited metal, and, subsequently floating away the first photoresist layer to expose the original metallization pattern while other unprotected regions, e.g., which include EC pads, have been selectively coated by the metal.

Additionally, because the proposed invention utilizes dry deposition process—either a magnetron sputter system or an Ion plating system (a form of vacuum evaporation)—the adhesion qualities of the deposited metals is excellent.

Lastly, because said second mask is a custom mask corresponding or conforming to the metallization pattern, delineation of the deposited metal layer is very accurate. The first mask is a coarse block out mask and therefore its alignment does not need to be precisely performed. This in turn results in an inexpensive and fast manufacturing step.

BRIEF DESCRIPTION OF THE DRAWINGS

The above and other objectives and advantages of this invention will be better understood with reference to the following detailed description of the invention read in conjunction with the accompanying figures in which.

DETAILED DESCRIPTION OF THE PREFERRED EMBODIMENT

For further comprehension of the invention, and of the objects and advantages thereof, reference will be had to the following descriptions and accompanying drawings and to the appended claims in which the various novel features of the invention are more particularly set forth.

Figure 1:
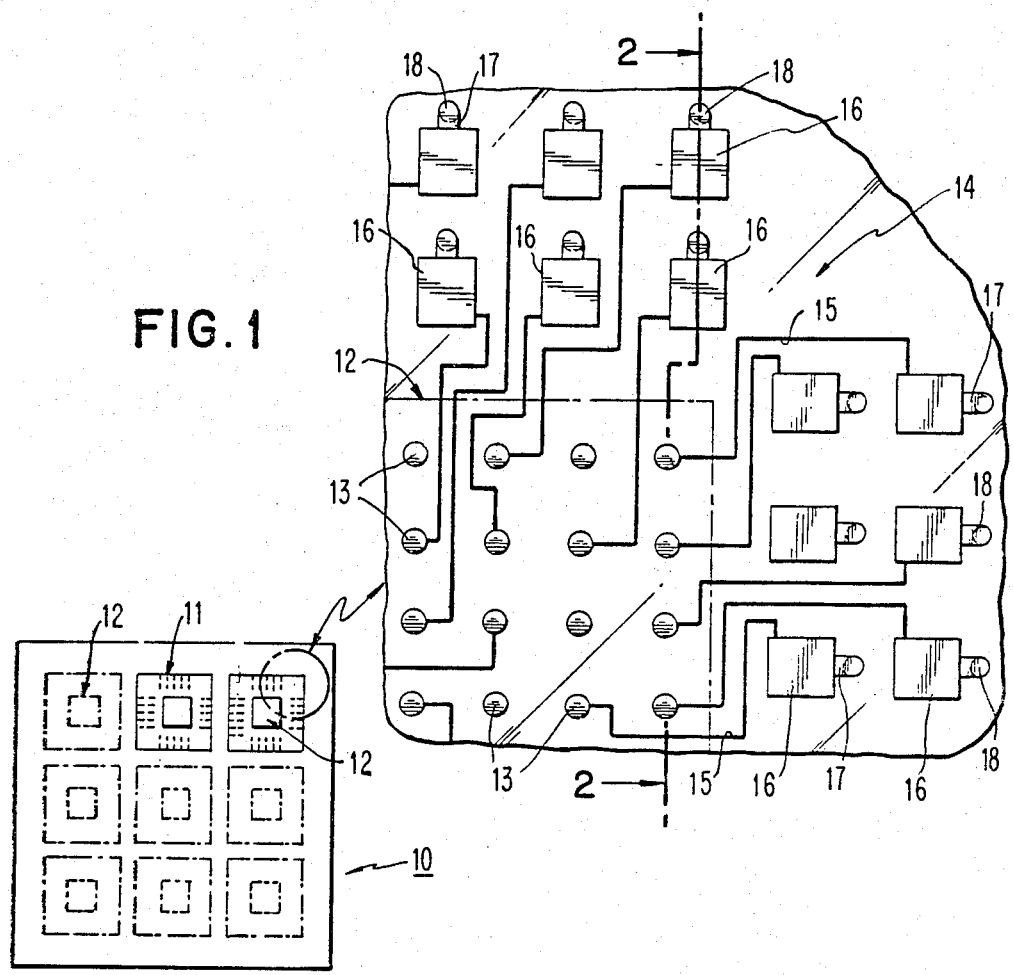
FIG. 1 is a schematic top view and a fragment thereof of an MLC substrate or carrier of the MCM (Multi Chip Module) type.
Figure 2:
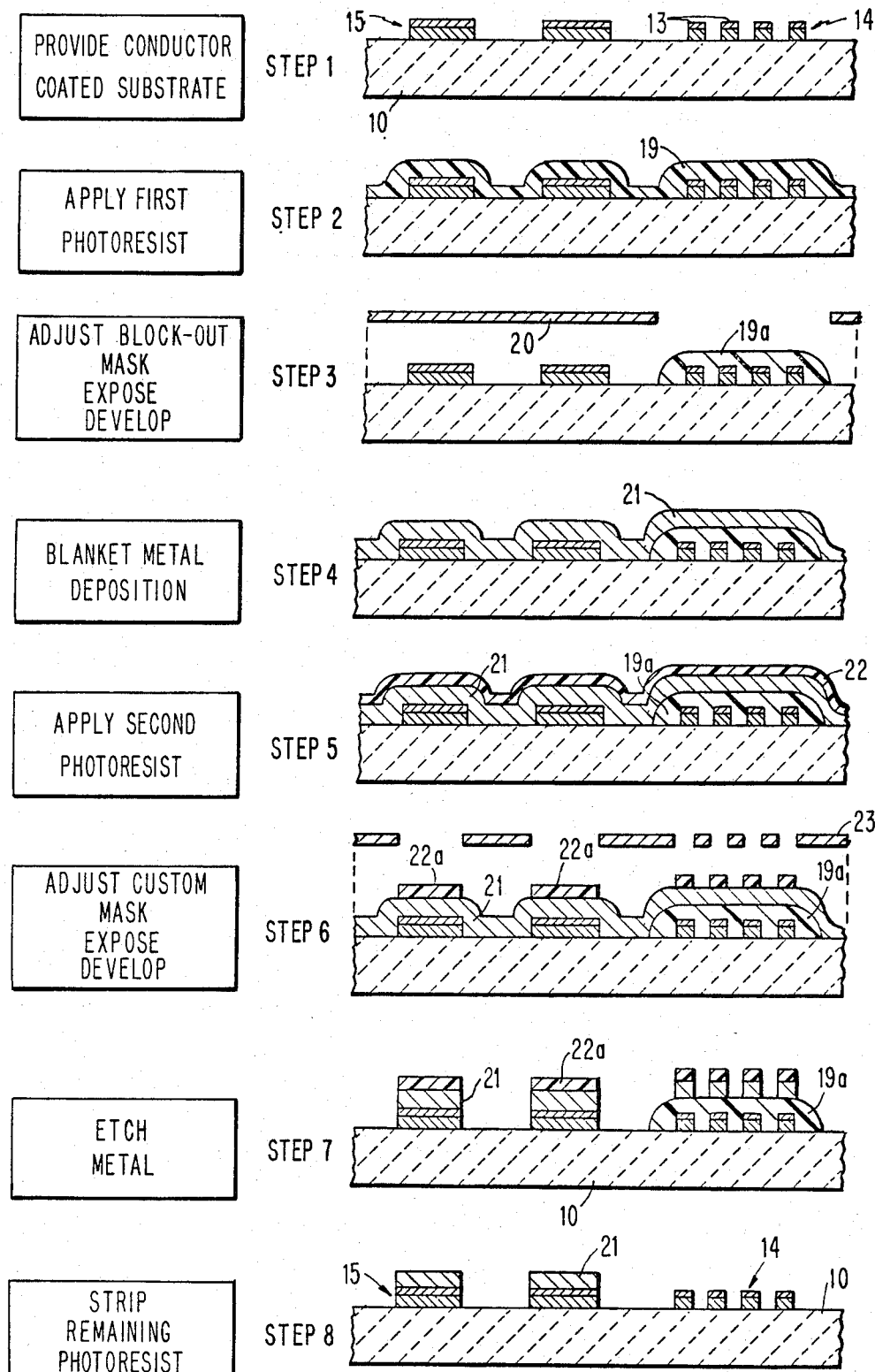
FIG. 2 is a flow chart illustrating the method steps of the invention and includes corresponding schematic, step by step, cross sectional views along line 2—2 of the MLC chip substrate shown in FIG. 1 at the respective steps.

Referring to FIGS. 1 and 2, there is depicted a fired ceramic substrate 10, typically a multilayer ceramic structure which can be produced by the method described in U.S. Pat. No. 3,518,756. Although FIG. 2 is illustrated in broken section, the internal metallurgical pattern in the substrate is not shown since it does not constitute a material part of this invention, which is directed to the treatment of existing exposed metallurgy pattern 14 at the surfaces of substrate 10. However, it is to be understood that substrate 10 need not be a multilayer structure, but could be solid with the metallurgical pattern 14 formed entirely on the surface thereof. Also, it is noted that the metallurgical pattern 14 can be disposed on more than one surface of the substrate, e.g. in MLC structures the existing metallurgical pattern cannot only be provided on the top surface of substrate 10 for electrical connection to terminal of a semiconductor device solder mounted thereto, but also extend to and at the opposite bottom surface of substrate 10 for securing thereto of I/O pins. Also, although the metallurgy 14 has been shown as extending in a raised pattern on substrate 10, it can also constitute exposed portions of via metallurgy.

The material of present conventional substrates is normally formed of alumina, or alumina plus other materials (e.g. glass-ceramic) such as described in U.S. Pat. No. 3,540,894. The depicted metallurgical pattern 2, shown on the surface of substrate 1 can be formed of a refractory metal, typically molybdenum, which was deposited prior to sintering.

More specifically, a schematic illustration of an ceramic substrate 10 having nine chip sites 11 is given in FIG. 1. A fragmented top view of the right corner of the substrate 10, has been also represented in FIG. 1 after having been enlarged. As is known, an IC (integrated circuit) chip 12 provided with solder balls (not shown) is flip-chip or face-down mounted on the substrate (carrier) I/O pads 13, by means of a conventional solder reflow process. As seen in FIG. 1, a metallization pattern 14 includes conductive lines 14 for fanning out from the chip mount sites, for electrical connection to Engineering Change (EC) pads 16. Those EC pads permit adjustment of the chip connection to facilitate reconnection in the event of defects detected in either chips or carrier circuitry, or to make desired engineering changes for any reasons. In substance, the metallurgical pattern 14 comprises at least two sets of conductive pads, e.g. the I/O pads 13 and the EC pads 16.

For sake of simplicity, only a schematic solid ceramic substrate 10 has been represented in FIG. 1, however, as is obvious in real practice, this substrate is more complex, for example, it may be a MLC substrate having an internal molybdenum conductive pattern. Some internal conductors are connected to both EC and I/O pads through molybdenum pads formed on the major surface of the substrate. These pads are first electroplated with Nickel, which is a metal having good adhesion characteristics with molybdenum, then covered with a thin flash gold layer in order to prevent oxidation of the nickel layer. An A. H. Kumar et al copending U.S. patent application, Ser. No. 359,469, filed Mar. 18, 1982, details all these steps and is therefore herein incorporated by reference thereto. Only EC pads need a further gold coating, so called heavy gold, to provide a better contacting surface for the connecting wires.

For this purpose, thin printed lines 17 run between the EC pads 16 and the MLC net entry points 18. If a change is to be made to the I/O assignments, the cut point is usually made on the printed circuit line 17. And engineering change wire is bonded to the EC pad in order to achieve the proper connection.

FIG. 2 shows a flow chart illustrating the method steps of the invention and includes corresponding, schematic, step by step, cross sectional views, of the MLC chip carrier as shown in FIG. 1, along line 2—2. Similar references are applied to similar elements in FIGS. 1 and 2, except for the conductive lines 15 and 17 and entry points 18 which have not been represented for sake of clarity.

In accordance with one preferred embodiment of the present invention a MLC substrate 10 provided with a metallization pattern 14 which includes EC pads 15 and I/O pads 13 (metal lines are not represented), formed in extension on a major surface of the substrate. I/O pads 13 are part of the chip foot print. All pads are comprised of nickel coated by a thin layer of gold (Step 1) as said above.

As shown in Step 2, a conventional first photoresist layer 19 is applied or blanket coated onto the entire surface of the substrate (Step 2).

Using a first mask 20, the photoresist said layer is pattern-wise exposed, and then developed in order to leave a protective layer 19a of hardened photoresist over the foot print area (e.g. I/O conductive pads 13) only, while the EC pads 15 remain exposed (Step 3). Because the first mask is a coarse block out mask, this step is not acute or critical. A thick blanket coat of metal 21, preferably a noble metal such as gold, is deposited onto the entire surface (Step 4). Because dry deposition techniques such as magnetron sputtering or ion plating may be used, the adhesion qualities of the deposited metal is excellent.

A second layer 22 of the same or another conventional photoresist is then applied (e.g. blanket coated) on the whole surface (Step 5). A second mask 23 is used to expose the resist, which is subsequently developed leaving a resist pattern 22a over and opposite to both the I/O and EC pads (Step 6). The second mask is a custom mask. It conforms to the ceramic substrate metallization pattern after the final curing has taken place, therefore there is no longer any problem of shrinkage. This mask represents exactly the metallization pattern with an excellent accuracy because in that preferred embodiment it has been used in the manufacture of the metallizated pattern described above in conjunction with Step 1. Because this mask is available, its use in the present invention does not require an extra manufacturing step. Method and apparatus for making such a custom mask are described in an A. Amendola et al U.S. patent application, Ser. No. 415,051 filed Sept. 7, 1982. Gold is then etched away according to the resist masking layer (Step 7). Lastly, all the protective resist layers 19a, 22a and the gold coating overlying the protective coating 19A are solvated.

As a result, the EC pads 15 have been selectively thickened with gold while the I/O pads remain unaffected.

Although the invention has been referenced specifically to MLC substrates employed for semiconductor device packaging applications, it is to be understood that the scope of this invention is not to be limited thereto, nor restricted to applications involving only MLC substrates.

On the other hand, while the invention has been illustrated and described with respect to the preferred embodiment of the invention, it is also to be understood that the invention is not limited to the precise method herein disclosed, and the right is reserved to all changes and modifications coming within the scope of the invention as defined in the appended claims.

Having thus described the invention, what is claimed as new, and desired to be secured by Letters Patent is:

1. A process for depositing metal at only selected subdivided portions of a metallization pattern pre-existing on a substrate comprising the steps of:
   (A) providing a substrate having said metallization pattern at a major surface;
   (B) blanket depositing a first photoresist layer to cover the said substrate major surface and said metallization pattern;
   (C) selectively exposing and developing the first photoresist layer on a pattern forming a first mask opposite to and only over a subdivided region of said metallization pattern;
   (D) depositing a blanket layer of said metal, over the entire substrate major surface;
   (E) depositing a second blanket layer of photoresist over the substrate major surface;
   (F) selectively exposing though a second mask and developing the second photoresist layer to define a second resist mask over and opposite to a second subdivided region of said metallization pattern;
   (G) etching the portions of the deposited metal layer which remain exposed; and,
   (H) solvating the resist masks for removal thereof together with overlying layers of said metal thereon over the first said subdivided region of said metallization pattern.

2. The process of claim 1 wherein said substrate is a multilayer ceramic substrate provided with both engineering change pads and input/output pads comprising said metallization pattern.

3. The process of claim 2 wherein said metallization pattern comprises gold coated nickel and said metal is gold.

4. The process of claim 1 wherein said first mask is a coarse block out mask which leaves hardened photoresist over the first said subdivided region comprised of input/output pads.

5. The process of claim 4 wherein said second mask is a custom mask conforming to said metallization pattern.

6. The process of claim 4 wherein said depositing system is selected from the group comprised of magnetron sputtering and ion plating systems.

7. The process of claim 5 wherein said metal is deposited in a system selected from the group comprised of magnetron sputtering and ion plating systems.

8. The process of claim 2 wherein said metal is deposited in a system selected from the group comprised of magnetron sputtering and ion plating systems.

9. The process of claim 3 wherein said metal is deposited in a system selected from the group comprised of magnetron sputtering and ion plating systems.

10. The process of claim 3 wherein said first mask is a coarse block out mask which leaves hardened photoresist over the first said subdivided region comprised of input/output pads.

11. The process of claim 10 wherein said second mask is a custom mask conforming to said metallization pattern.

12. The process of claim 11 wherein said metal is deposited in a system selected from the group comprised of magnetron sputtering and ion plating systems.

13. The process of claim 10 wherein said metal is deposited in a system selected from the group comprised of magnetron sputtering and ion plating systems.

14. The process of claim 2 wherein said first mask is a coarse block out mask which leaves hardened photoresist over the first said subdivided region comprised of input/output pads.

15. The process of claim 14 wherein said second mask is a custom mask conforming to said metallization pattern.

16. The process of claim 15 wherein said metal is deposited in a system selected from the group comprised of magnetron sputtering and ion plating systems.

17. The process of claim 14 wherein said metal is deposited in a system selected from the group comprised of magnetron sputtering and ion plating systems.

* * * * *